United States Patent
Naylor et al.

(10) Patent No.: US 11,062,995 B2
(45) Date of Patent: Jul. 13, 2021

(54) INTERCONNECT FABRICATED WITH FLOWABLE COPPER

(71) Applicant: INTEL CORPORATION, Santa Clara, CA (US)

(72) Inventors: Carl H. Naylor, Portland, OR (US); Mauro J. Kobrinsky, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/597,172

(22) Filed: Oct. 9, 2019

(65) Prior Publication Data

US 2021/0111129 A1 Apr. 15, 2021

(51) Int. Cl.
*H01L 23/532* (2006.01)
*H01L 23/522* (2006.01)
*H01L 23/528* (2006.01)
*H01L 21/02* (2006.01)
*H01L 21/768* (2006.01)
*H01L 27/088* (2006.01)
*H01L 23/535* (2006.01)

(52) U.S. Cl.
CPC .. *H01L 23/53238* (2013.01); *H01L 21/02568* (2013.01); *H01L 21/76873* (2013.01); *H01L 21/76877* (2013.01); *H01L 23/5226* (2013.01); *H01L 23/5283* (2013.01); *H01L 23/535* (2013.01); *H01L 27/088* (2013.01)

(58) Field of Classification Search
CPC ......... H01L 23/53238; H01L 21/02568; H01L 21/76873; H01L 21/76877; H01L 23/5226; H01L 23/5283; H01L 23/535
See application file for complete search history.

(56) References Cited

U.S. PATENT DOCUMENTS

| 6,521,996 B1* | 2/2003 | Seshan | H01L 24/03 257/737 |
|---|---|---|---|
| 2004/0229456 A1* | 11/2004 | Andricacos | C25D 3/38 438/642 |
| 2004/0229462 A1* | 11/2004 | Gracias | H01L 21/76877 438/689 |
| 2008/0128812 A1* | 6/2008 | Bernstein | H01L 21/84 257/347 |

(Continued)

OTHER PUBLICATIONS

Kaitlin McCreery, "Fabrication and Electrical Measurement of Copper Sulfide Memristors", Duke University, Senior Honors Thesis, Apr. 26, 2017, 51 pages.

(Continued)

*Primary Examiner* — Feifei Yeung Lopez
(74) *Attorney, Agent, or Firm* — Schwabe, Williamson & Wyatt P.C.

(57) ABSTRACT

An integrated circuit includes a base with one or more semiconductor devices. An insulating material is over the base and an interconnect structure is over the base. The interconnect structure includes vertical conductors extending through the insulating material in a spaced-apart arrangement. The interconnect structure comprises a conductor and a chalcogen, the chalcogen present in an amount of up to 5 atomic percent. In some embodiments, the chalcogen is present in an amount less than 2 atomic percent or less than 1 atomic percent.

20 Claims, 9 Drawing Sheets

(56) References Cited

U.S. PATENT DOCUMENTS

| | | | | |
|---|---|---|---|---|
| 2011/0018036 A1* | 1/2011 | Hwang | ................ | H01L 27/115 257/208 |
| 2013/0237050 A1* | 9/2013 | Kikutani | ........... | H01L 27/11519 438/618 |
| 2013/0260527 A1* | 10/2013 | Carter | ................... | H01L 45/085 438/381 |
| 2016/0064280 A1* | 3/2016 | Ookita | ................. | H01L 21/288 257/758 |

OTHER PUBLICATIONS

G. Chattopadhyay et al., "Evaluated Phase Diagrams of Binary Metal-Tellurium Systems of the D-Block Transition Elements", Bhabha Atomic Research Centre, Bombay, India, 1989, 126 pages.

* cited by examiner

Cu-Se phase diagram

US 11,062,995 B2

INTERCONNECT FABRICATED WITH FLOWABLE COPPER

BACKGROUND

An integrated circuit typically includes a variety of electronic components or devices that exploit the electronic properties of semiconductor materials, such as silicon (Si), germanium (Ge), gallium arsenide (GaAs), and indium phosphide (InP). An integrated circuit may include transistors, capacitors, diodes, and other devices. One example of a transistor is a field-effect transistor (FET), which includes three terminals: a gate, a source, and a drain. A FET uses an electric field applied by the gate to control the electrical conductivity of a channel through which charge carriers (e.g., electrons or holes) flow between the source and drain. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits. FETs may be used in memory structures, power applications, and logic circuits, to name a few examples.

The source, drain, and gate structures of a FET are example locations where electrical connections are made in some integrated circuits. These structures are generally located at the device level of the IC and are processed during the first stage of the IC fabrication process, also referred to as front-end-of-line (FEOL) processing. These and other structures may be electrically connected, for example, to a voltage supply, to another device, or to a signal bus in a metallization layer located in a different level of the integrated circuit. For example, an integrated circuit may include several metallization layers located vertically above the device level and that are fabricated as part of the second portion of the IC fabrication process, also referred to as back-end-of-line (BEOL) processing. An interconnect structure is one way to make electrical connections between structures in different levels of an integrated circuit and may include conductive materials (e.g., copper) that extend vertically within one or more metallization layers and/or horizontally within a metallization layer. Various metallization layers can be connected together and/or to devices with, for example, conductive vias that extend vertically through and between various metallization layers of the integrated circuit.

Figure 1:
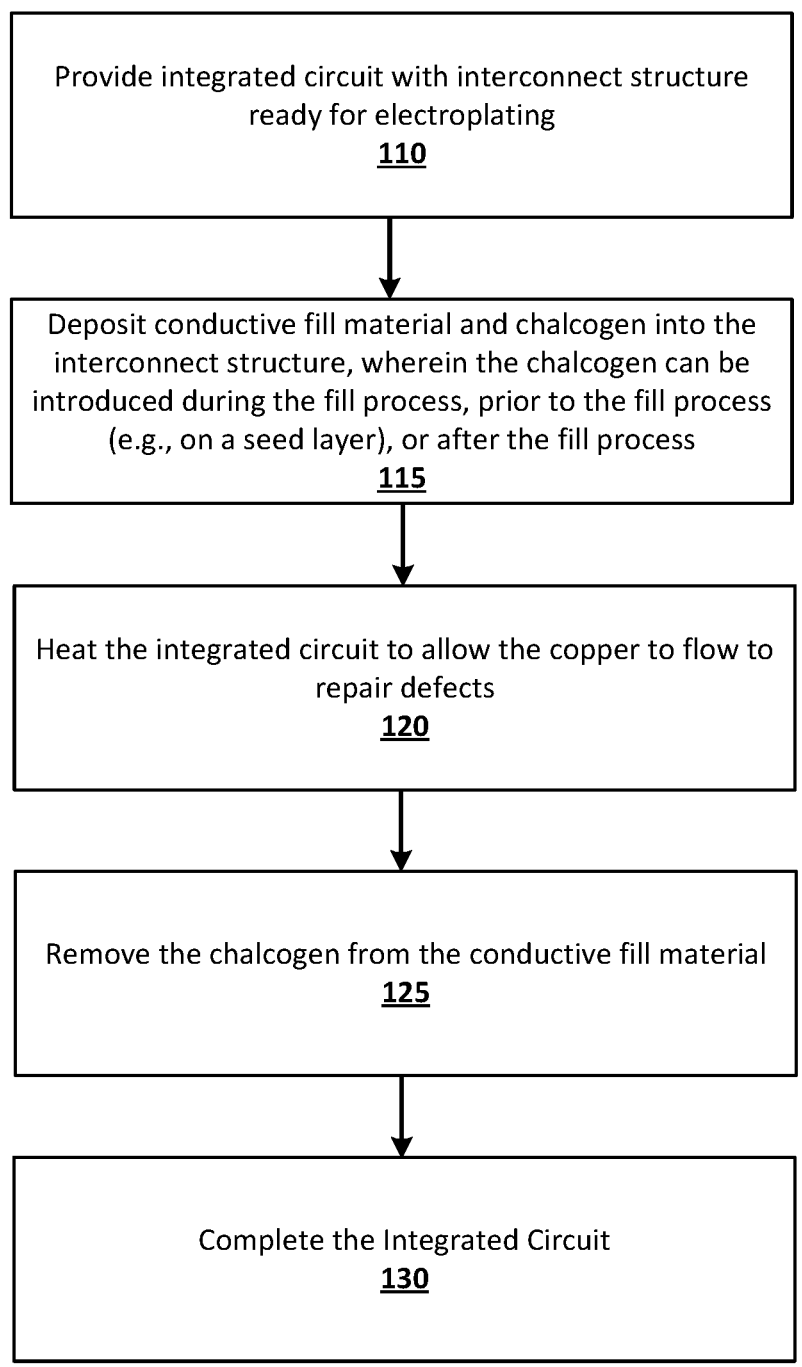
FIG. 1 illustrates a method of fabricating an interconnect structure of an integrated circuit, in accordance with some embodiments of the present disclosure.
Figure 2:
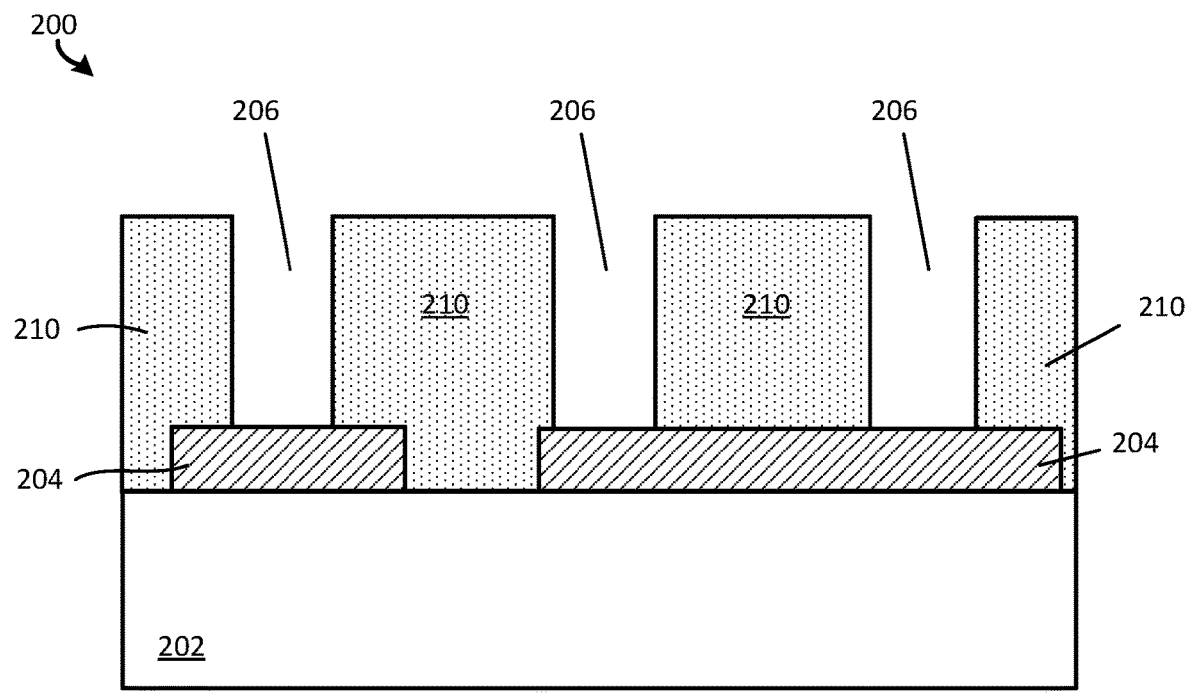
FIG. 2 illustrates a cross-sectional view of part of a partially formed integrated circuit ready for an interconnect fill process, in accordance with an embodiment of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for fabricating interconnect structures using a metal chalcogenide to repair defects in the conductive lines and vias. For example, according to an embodiment, use of copper chalcogenides as part of the interconnect fill process allows for the repair of pinholes and other defects that result from a standard electroplating process. Such defects may include, for instance, voids, unfilled vias, and other imperfections in the interconnect structure. In one example embodiment, a method of fabricating an interconnect structure includes providing a die or wafer having an interconnect structure ready for electroplating. The interconnect structure can be electroplated with copper using, for example, traditional electroplating techniques, although other deposition techniques, such as chemical vapor deposition (CVD), physical vapor deposition (PVD), and electroless deposition, can be used as will be appreciated in light of this disclosure. In one such embodiment, the plated copper is subsequently heated in a chalcogen environment, such as hydrogen disulfide ($H_2S$). During this process, the chalcogen and the copper form a copper-chalcogen composition that has a relatively low melting temperature suitable for back-end processing (e.g., below 450° C., such as less than 200° C. in some cases). In another example embodiment, a chalcogen may be deposited on a copper seed layer prior to deposition of the copper fill. In yet another example embodiment, a copper chalcogenide is deposited as the conductive fill, such as with an electroplating, PVD, CVD, or atomic layer deposition (ALD) process that includes both copper and the chalcogen. Combinations of such processes can also be used, as will be appreciated. In any such cases, a subsequent low temperature annealing process causes the copper chalcogenide to reflow within the predefined interconnect structure, thereby eliminating or otherwise reducing pinholes and other defects. The resulting structure can then be further annealed in an inert or reducing atmosphere to remove the chalcogen. Numerous variations will be apparent in light of this disclosure.

For instance, in one specific example embodiment where the chalcogen is sulfur, the stoichiometric ratio of copper to sulfur is from 0.5 to 2.0 (i.e., 0.5≤Cu/S≤2). Once the copper sulfide interconnect structure is deposited by way of any of the various techniques provided herein, the structure can then be heated to a temperature above the melting point of the copper sulfide (e.g., around 150° C.). Once melted, the liquid copper-chalcogenide re-flows within the confines of the interconnect structure to eliminate voids, fill unfilled vias, and repair other such defects. The interconnect structure can then be further annealed in an inert or reducing atmosphere (e.g., 5-15% $H_2$ in nitrogen at a temperature of about 350° C. for about 2 hours to remove the sulfur from the copper. As will be appreciated, the reducing process effectively removes the sulfur (or other chalcogen) to below an acceptable threshold, such as below 2 atomic percent, in accordance with some embodiments. At such relatively low chalcogen concentrations, the copper behaves substantially like pure copper, including with respect to performance parameters such as melting point and conductivity. Thus, the impact of any trace amounts of chalcogen (e.g., below 2 atomic percent, or other suitable threshold) remaining in the interconnect structure is acceptable. Although the techniques provided herein can be used at any phase of the fabrication process and for any number of interconnect structures prone to defects, they are particularly well-suited for the first few metallization levels above the device level of an integrated circuit or other such metallization layers that tend to have small dimensions (e.g., via diameter of 50 nm or less) that are more prone to defects such as voids.

Thus, the interconnect structure according to an embodiment of the present disclosure has one or more interconnect levels that may exhibit trace amounts of a chalcogen atom and have a reduced number of defects (or zero defects) compared to a similar shaped interconnect structure resulting from existing techniques. For example, the resulting conductive lines and vias may contain up to 2 or 5 atomic percent sulfur, selenium, or tellurium. In some instances, the residual chalcogen may be in the form of copper chalcogenide crystals surrounded or partly surrounded by the copper of the interconnect structure. In some cases, the residual chalcogen may be present in crystalline form, such as a relatively small quantity of copper sulfide (e.g., CuS or $Cu_2S$). Although the present disclosure is discussed in the context of a copper conductor, other conductive materials can benefit from the disclosed methodologies, such as aluminum, cobalt, nickel, and iron, to name a few examples. Numerous variations and embodiments will be apparent in light of the present disclosure.

General Overview

As previously explained, an interconnect can be formed by electroplating the pathways of the interconnect structure. The resulting copper-filled interconnect structure may include some defects such as voids and holes. For example, the copper may fail to fully deposit into some via openings due to the small size and/or large aspect ratio (e.g., due to pinch-off at top of tall trench being filled). Discontinuities in the interconnect effectively render some devices useless and reduce die yield for the wafer. Since copper has a relatively high melting point of 1085° C., without more the copper cannot be re-flowed to improve the quality of the copper fill, without damaging other components of the integrated circuit (e.g., transistors of the device layer will be destroyed or degraded). One possible approach to improve die yield is to increase the thickness of a copper seed layer applied to the interconnect structure. However, the effectiveness of this approach is greatly reduced or ceases altogether when the features being filled are smaller than a minimum feature size. Accordingly, the problem of defective copper fill will likely worsen as transistors are made smaller and vias and trenches narrower. Thus, a need exists for improving the quality of interconnect structures. The present disclosure addresses this need and others by providing methodologies for forming an interconnect structure using a conductive material that is temporarily modified with a chalcogen so that the conductive material can be reflowed in situ at relatively low temperatures, and subsequently restored to its original form (e.g., copper chalcogenide is converted back to copper).

A multitude of different integrated circuits and systems can benefit from the techniques described herein, including, but not limited to, various field-effect transistors (FETs), memory structures (e.g., planar or vertical random access memory (RAM)), complementary transistor circuits such as complementary metal-oxide-semiconductor (CMOS) circuits, processors, signal processing chips, and computing systems, to name a few examples. In some embodiments, the techniques may be used to benefit integrated circuit structures that include devices having critical dimensions in the nanometer (nm) range (e.g., formed at the 22, 14, 10, 7, 5, or 3 nm process nodes, or beyond).

Note that materials described as being "compositionally different" or "compositionally distinct" as used herein refers to two materials that have different chemical compositions. This compositional difference may be, for instance, by virtue of an element that is in one material but not the other (e.g., CuS is compositionally different from CuSe), or by way of one material having all the same elements as a second material but at least one of those elements is intentionally provided at a different concentration in one material relative to the other material (e.g., CuS is compositionally different from $Cu_2S$. In still other embodiments, compositionally distinct materials may further refer to two materials that have different crystallographic orientations. For instance, silicon <111> is compositionally distinct or different from silicon <100>.

As also used herein, the term "low-κ" refers to a material having a dielectric constant equal to or less than that of silicon dioxide ($SiO_2$), which has a value of 3.9 according to some measurement methods. Examples of low-κ materials include amorphous carbon, spin-on glass, polymers, silicon oxycarbides (SiOCH), fluorine-doped $SiO_2$, carbon-doped $SiO_2$, porous silicon dioxide or other porous insulators, and silsesquioxanes, to provide a few examples. As also used herein, the term "high-κ" refers to materials having a dielectric constant greater than that of silicon dioxide ($SiO_2$). Examples of high-κ dielectric materials include hafnium dioxide ($HfO_2$), zirconium dioxide ($ZrO_2$), and titanium dioxide ($TiO_2$) to provide some examples. Moreover, note the stoichiometry of any such dielectric compounds or any other compounds for that matter may vary from one embodiment to the next, and any such compounds represented without stoichiometric coefficients or values are intended to represent all forms of that compound (e.g., whether insulating, conducting, or semiconducting).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some particular embodiments, SEM/TEM, EDX, XDS, and or TOF-SIMS can be used to detect copper in one or more metallization layers that has residual amounts of a chalcogen. For example, EDX can be used to detect copper with residual levels (e.g., <5 atomic percent, or <2 atomic percent) of sulfur, selenium, or tellurium and/or trace amounts of copper chalcogenide crystals in the copper lines (e.g., copper sulfide crystals).

Architecture and Methodology

FIG. 1 illustrates a method 100 of fabricating an interconnect structure with reduced defects, in accordance with some embodiments of the present disclosure. FIGS. 2-5 illustrate example interconnect structures formed when carrying out method 100 of FIG. 1, in accordance with some embodiments. Note that method 100 is discussed in the context of an interconnect structure located in the first metallization layer above front-end-of-line devices in a device level of an integrated circuit, for example. However, method 100 is not restricted to fabrication of the first metallization layer and interconnect structures of the present disclosure similarly can be fabricated in the second, third, fourth, or any other metallization layer of an integrated circuit, as will be appreciated.

In general, and as will be appreciated in light of this disclosure, method 100 can be performed using any number of standard semiconductor fabrication techniques, including photolithography, wet and/or dry etching processes, chemical mechanical polishing, deposition or epitaxial growth processes (e.g., electroplating, electroless plating, chemical vapor deposition or CVD, physical vapor deposition or PVD, atomic layer deposition or ALD, vapor phase epitaxy or VPE, molecular beam epitaxy or MBE, liquid phase epitaxy), and/or any other suitable processing techniques.

Method 100 of FIG. 1 includes providing 110 an integrated circuit with an interconnect structure ready for filling by deposition of a conductive material. In one such embodiment, shown in the cross-section of FIG. 2, an integrated circuit 200 includes a base or substrate 202 with metal contacts 204 exposed by via trenches 206 defined in and extending vertically through a layer of insulator material 210 on or over the substrate 202. The contacts 204 can be, for instance, on devices in a device level of the integrated circuit (e.g., source, drain, or gate contacts on a transistor or diode; capacitor electrodes, resistor electrodes, etc.), conductive pads or traces directly on or in the substrate 202, or other conductive structures. The via trenches 206 can be formed using standard techniques (e.g., masking and etching) and extend between a first metallization layer and devices in a device layer of the IC. Although the geometry and shape of the trenches 206 can vary from one embodiment to the next, in some cases they are cylindrical and have a diameter or cross-sectional dimension from 10-100 nm, including 20-80 nm, 20-50 nm, 30-100 nm, 30-80 nm 30-50 nm, 40-100 nm, 40-80 nm, 40-50 nm, or other suitable size. In other embodiments, the via trenches 206 have a greater cross-sectional dimension, are square or rectangular or other shape, and/or are located in a second, third, or other metallization layer above the device level. While single damascene via trenches are shown, other embodiments may include dual damascene via trenches. Likewise, the via trenches may be tapered (e.g., wider at top than bottom), hour-glassed or bead-shaped, or otherwise have a shape other than the cross-sectional shapes depicted, as will be appreciated.

The various materials can be any suitable materials as will be appreciated. For example, the integrated circuit can include any one or more of a variety of devices (e.g., transistors, diodes, filters, etc) formed on substrate 202. The substrate 202 can be bulk semiconductor material selected from group III-V materials and group IV materials, such as silicon, silicon carbide (SiC), gallium nitride (GaN), or gallium arsenide (GaAs), to name a few examples. In some embodiments, the substrate 202 can comprise a layer of semiconductor material deposited or grown on a base, such as silicon carbide layer epitaxially grown on a sapphire base. Further, the substrate 202 can include layers of insulating material and semiconducting material, such as silicon with a buried oxide layer. In a more general sense, the substrate 202 can be any material or structure upon which an integrated circuit can be formed. The insulator material 210 can be any number of insulator materials, such as silicon dioxide, silicon nitride, silicon carbide, silicon oxynitride, polymer, or porous versions of any of these, to name a few examples. The metal contacts 204 can be any number of suitable conductive materials, such as copper, although other conductive materials such as tungsten, nickel, titanium, silver, gold, tantalum, and alloys including any of these. Note the contacts 204 may include multiple components such as, for instance, a barrier layer or liner (e.g., tantalum nitride) and a central fill portion (e.g., tungsten). The via trenches 206 may be lined with barrier or liner layers as well according to some embodiments, as will be discussed in turn.

Figure 3:
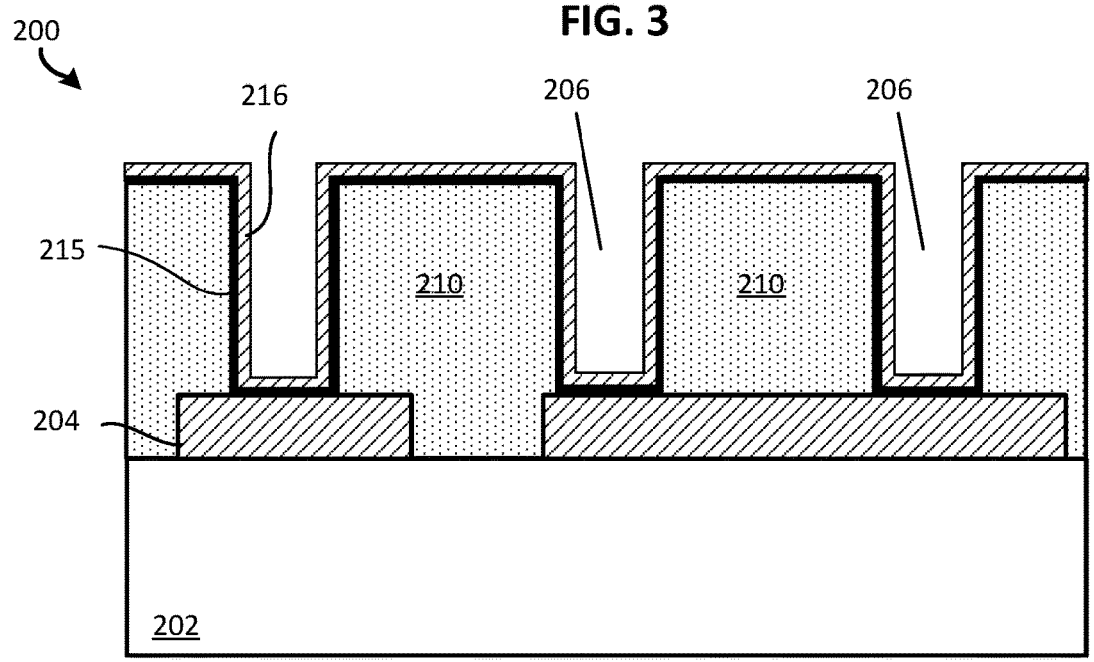
FIG. 3 illustrates the structure of FIG. 2 after depositing a diffusion barrier layer and a conductive seed layer, in accordance with an embodiment of the present disclosure.

Method 100 of FIG. 1 continues with depositing 115 conductive fill material and chalcogen into the interconnect structure. The chalcogen can be introduced in various ways, such as prior to depositing the conductive fill material, during deposition of the conductive fill material, or after deposition of the conductive fill material. An example for each of these chalcogen scenarios will be provided in turn. As previously explained, the conductive fill material can be any number of metals, but in some embodiments is copper. In some embodiments, the depositing 115 includes first depositing a diffusion barrier or liner. The diffusion barrier or liner can be provisioned using standard processing (e.g., ALD, CVD, PVD, or a sputtering process), and in some specific embodiments is a layer of tantalum or tantalum nitride (e.g., TaN), cobalt, ruthenium, tungsten nitride (e.g., $W_2N$, WN, $WN_2$), titanium nitride (TiN) or other suitable liner. The depositing 115 may also include depositing a seed or adhesion layer (e.g., copper deposited by way of ALD, CVD, PVD, or a sputtering process). FIG. 3 illustrates the integrated circuit 200 of FIG. 2 after depositing a barrier layer 215 (e.g., tantalum nitride) and a seed layer 216 (e.g., copper), according to some example embodiments. As shown in this example, the barrier layer 215 and the seed layer 216 each have a uniform thickness along horizontal and vertical surfaces. Other embodiments may not have such uniformity or may not include such layers or may include other layers, depending on factors such the processes used and desired performance.

With any preliminary layers provisioned (e.g., barrier, liner, adhesion, and/or seed layers), the depositing 115 continues with depositing a bulk fill material, such as copper, along with a chalcogen. As noted above, the chalcogen can be introduced at various times with respect to this bulk fill process, as will now be discussed in turn with respect to FIGS. 4A, 4B, and 4C. For purposes of discussion, assume the interconnect fill material is copper and the deposition process to be used is electrolytic electroplating, although other fill materials and deposition techniques can be used, as will be appreciated.

Figure 4A:
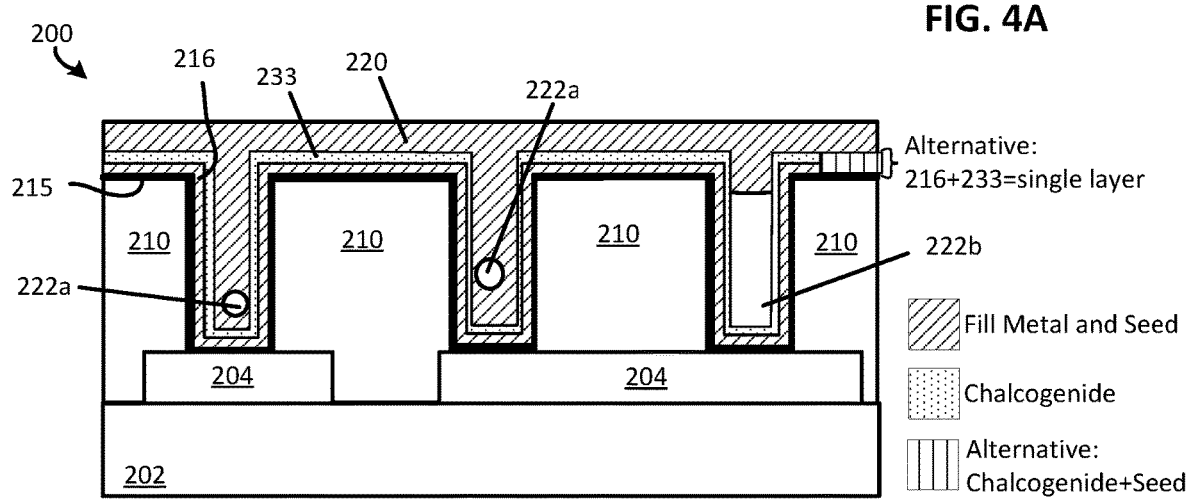
FIG. 4A illustrates the structure of FIG. 3 after depositing a conductive fill material that includes a chalcogen, in accordance with some embodiments of the present disclosure.

In one example embodiment, and with reference to FIG. 4A, prior to the electroplating of copper to fill the interconnect structure, the depositing 115 includes depositing a chalcogen layer 233 over the conductive seed layer 216, or otherwise on the exposed walls of the trench being filled. For instance, in one such example embodiment, a copper seed layer 216 is deposited on a tantalum nitride barrier layer 215, and then a chalcogen layer 233 is deposited on the seed layer 216. The chalcogen layer 233 can be, for instance, sulfur. Alternatively, as shown in the upper right corner of FIG. 4A, the seed layer 216 and the chalcogen layer 233 can effectively be combined into one layer, such as a copper sulfide layer, rather than two discrete layers. Any such depositions can be done, for instance, using CVD, PVD, or ALD. In some example embodiments, the chalcogen-containing layer is provided by exposing a copper seed layer 216 to a chalcogen atmosphere at temperatures from room temperature to about 450° C., either after the seed layer 216 is fully deposited (to provide layer 233) or while the seed layer 216 is being formed (to provide the alternative combination layer 216+233). The depositing 115 then continues with electroplating copper or other suitable fill metal onto the chalcogen layer 233 (or alternatively, electroplating copper on the combination seed-chalcogen layer) to fill the remaining portion of the interconnect structure.

Figure 4B:
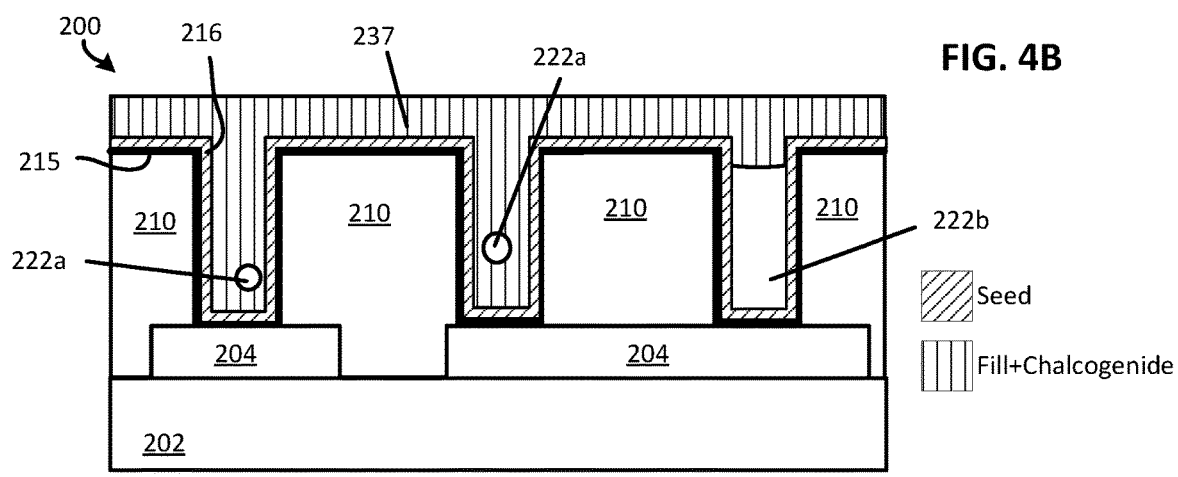
FIG. 4B illustrates the structure of FIG. 3 after depositing a conductive fill material and a chalcogen layer, in accordance with another embodiment of the present disclosure.

In another embodiment, the chalcogen can be deposited throughout or otherwise during the bulk fill process. For instance, one such example case is depicted in FIG. 4B, wherein the depositing 115 includes an electroplating, CVD, or PVD process of a copper chalcogenide 237, such as copper sulfide, as discussed above with respect to FIG. 4A. The stoichiometric ratio of copper to chalcogen can be, for example, from 0.1 to 10 (e.g., 0.1≤Cu/chalcogen≤10), including 0.1 to 5 (e.g., 0.1≤Cu/chalcogen≤5) and 0.5 to 2.0 (e.g., 0.5≤Cu/chalcogen≤2), where the chalcogen is sulfur, selenium, or tellurium, according to some embodiments. In the example case shown, the copper chalcogenide 237 is deposited over the seed layer 216. Alternatively, the depositing 115 may include deposition of copper and sulfur in alternating or sequential processes to provide a more stratified fill structure. As will be appreciated, the deposition can be modified to include other chalcogens, such as selenium or tellurium, and the present disclosure is not intended to be limited to sulfur. Likewise, while copper is used examples herein, other embodiments may include other fill metals.

Figure 4C:
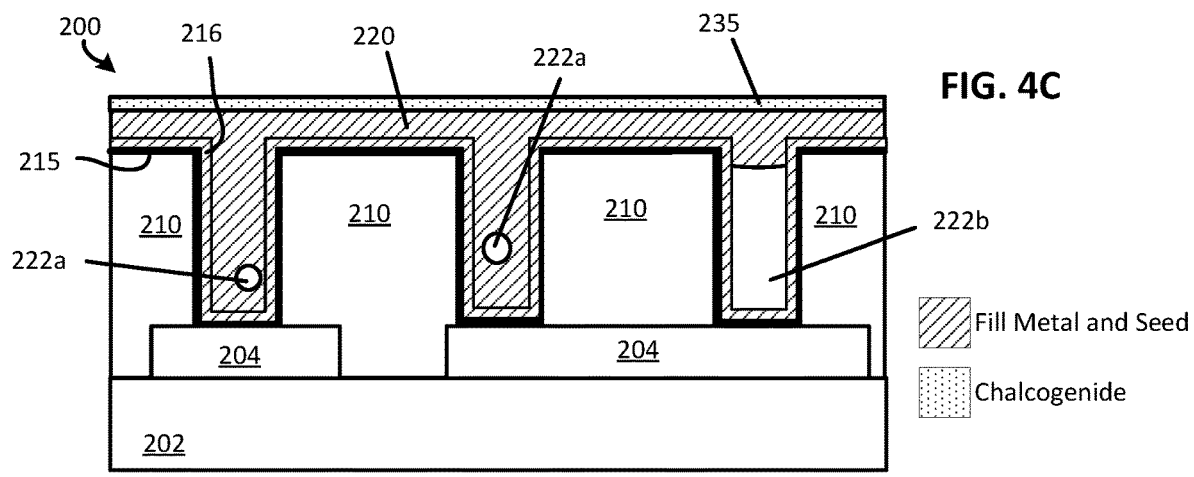
FIG. 4C illustrates the structure of FIG. 3 after depositing a conductive fill material and a chalcogen layer, in accordance with another embodiment of the present disclosure.

In yet another embodiment, the chalcogen can be deposited after the bulk fill process. For example, one such example case is depicted in FIG. 4C, wherein the depositing 115 includes using an electroplating process to fill the interconnect structure with a bulk fill layer 220, such as copper, and then exposing the filled structure to sulfur or other chalcogen to provide an chalcogen layer 235 on the bulk fill layer 220. Note the chalcogen can be provided as discussed with reference to FIG. 4A.

Other embodiments may include a combination of FIGS. 4A-C, such as both chalcogen layers 233 and 235 below and above the bulk fill material 220, or both chalcogen layers 233 and 235 below and above a bulk fill material that further comprises a chalcogen or is stratified with a chalcogen. Numerous such embodiments and variations will be appreciated in light of this disclosure.

As can be further seen in each of the example embodiments of FIGS. 4A-C, the bulk fill material 220 (FIGS. 4A and 4C) or 237 (FIG. 4B) includes defects 222, which include voids 222a in conductive lines and an unfilled or partially-filled via 222b. Such defects 222 can be detected, for example, by electrical test methods that show an increase in resistance or an open circuit, depending on the severity of the defect. Note that defects 222 may not result or may otherwise be fleeting if the heating at 120 of method 100 (as will be discussed in turn) is performed contemporaneously with the depositing 115, as the fill material containing chalcogen will liquefy or otherwise flow at a relatively low temperature, as will be further discussed with respect to FIGS. 6A-C.

With further reference to FIG. 1, the method 100 continues with heating 120 the integrated circuit structure to allow the copper chalcogenide (or other chalcogenide fill material) flow, thereby effectively repairing any defects 222. As noted above, note that heating 120 may be carried out simultaneously with the depositing 115, but are shown as separate processes for purpose of clarity. In some embodiments, heating 120 is performed in a furnace or using radio frequency (RF) heating, for example. When a furnace is used, the integrated circuit 200 may be heated, for example, for a period of 30 minutes to 24 hours at a temperature in the range of about 75° C. to 500° C., or as needed to cure defects in the interconnect structure, according to some example embodiments. When RF heating is used, one or more short heating cycles may be used to achieve a similar temperature range of heating, such as heating for 1 to 60 seconds to mix the copper and the chalcogen, according to still other example embodiments. As will be appreciated, the duration of heating may be longer for embodiments such as the ones shown in FIGS. 4A and 4C, as mixing the chalcogen into the bulk fill material from just the top or bottom may take longer.

In contrast, the duration of heating may be relatively shorter for embodiments such as the ones shown in FIG. 4B, where the chalcogen is mixed throughout the body of the fill material, or other embodiments where the chalcogen is both above and below the body of bulk fill material. Numerous variations will be apparent in light of the present disclosure.

As will be further appreciated, the composition of the chalcogenide fill material may also affect the temperature at which the heating 120 is conducted. For example, compositions of copper and sulfur have a melting point of about 100° C. when the sulfur concentration is about 35 atomic percent (e.g., $Cu_{1.8}S$). Accordingly, it is believed that copper chalcogenides are formed at relatively low temperatures (e.g., 200° C.), at least locally, in a liquid phase that enables the copper to flow and repair defects 222 in the interconnect structure. Similarly, when other chalcogens or mixtures of chalcogens are used, a copper-chalcogen composition is formed that has a melting point below 450° C., allowing the copper to flow at a relatively low temperature and repair defects in the copper.

As previously noted, suitable chalcogens include sulfur, selenium, and tellurium. Polonium may also be acceptable in theory, for certain select applications, but has the added challenge of being highly radioactive. As will now be discussed, compositions of copper and sulfur, copper and selenium, or copper and tellurium each have a liquid phase with a melting point well below that of pure copper.

Figure 6:
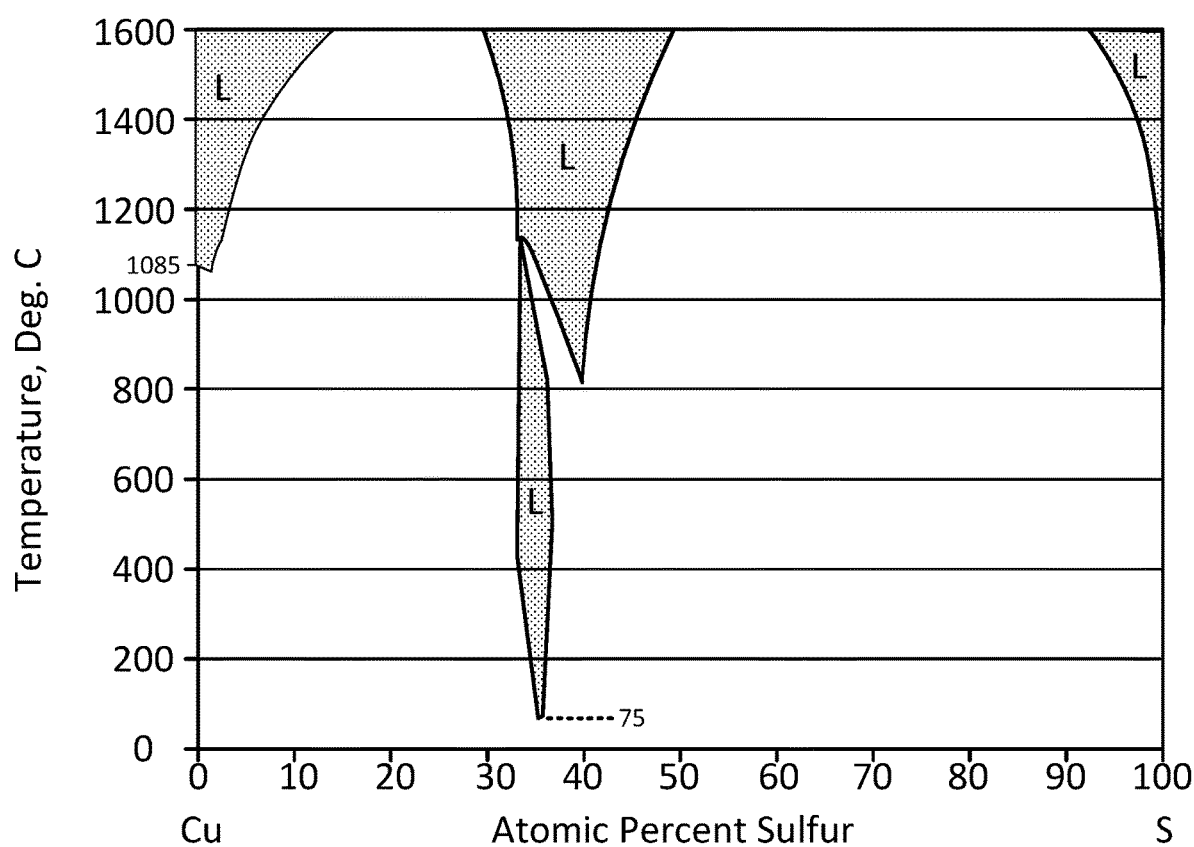
FIG. 6 is a binary copper-sulfur phase diagram showing liquid phase regions.

FIG. 6 is a binary phase diagram for copper and sulfur. The x axis represents the sulfur content in atomic percent and the y axis represents the temperature in degrees Celsius. Liquid phase regions are shown shaded in FIG. 6 and labeled with an L. Note that some compositions with about 33 to 37 atomic percent sulfur have a melting point well below that of pure copper (~1185° C.). In particular, compositions with about 35-36 at % sulfur have a melting point as low as about 75° C. Methodologies of the present disclosure can utilize the low melting point of these copper-sulfur compositions to provide a flowable copper that repairs defects 222 in the interconnect structure.

Figure 7:
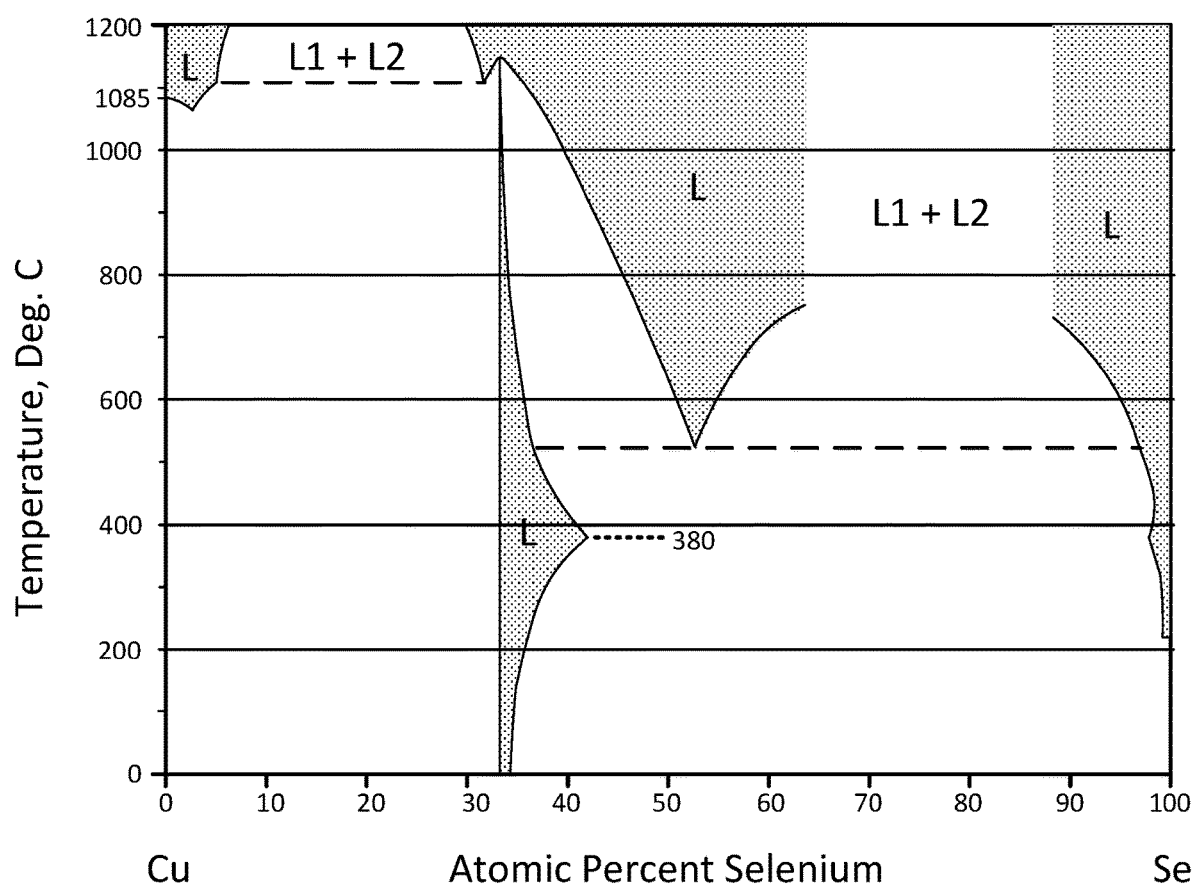
FIG. 7 is a binary copper-selenium phase diagram showing liquid phase regions.

FIG. 7 is a binary phase diagram for copper and selenium. The x axis represents the selenium content in atomic percent and the y axis represents the temperature in degrees Celsius. Liquid phase regions are shown shaded in FIG. 7 and labeled with an L. Note that some compositions with about 33 to 42 atomic percent selenium have a melting point well below that of pure copper (~1185° C.). In particular, compositions with about 33-35 at. % selenium have a melting point at room temperature. Compositions from about 33 to 42 at. % selenium have a melting point of about 380° C. or below. Methodologies of the present disclosure can utilize the low melting point of these copper-selenium compositions to provide a flowable copper that repairs defects 222 in the interconnect structure.

Figure 8:
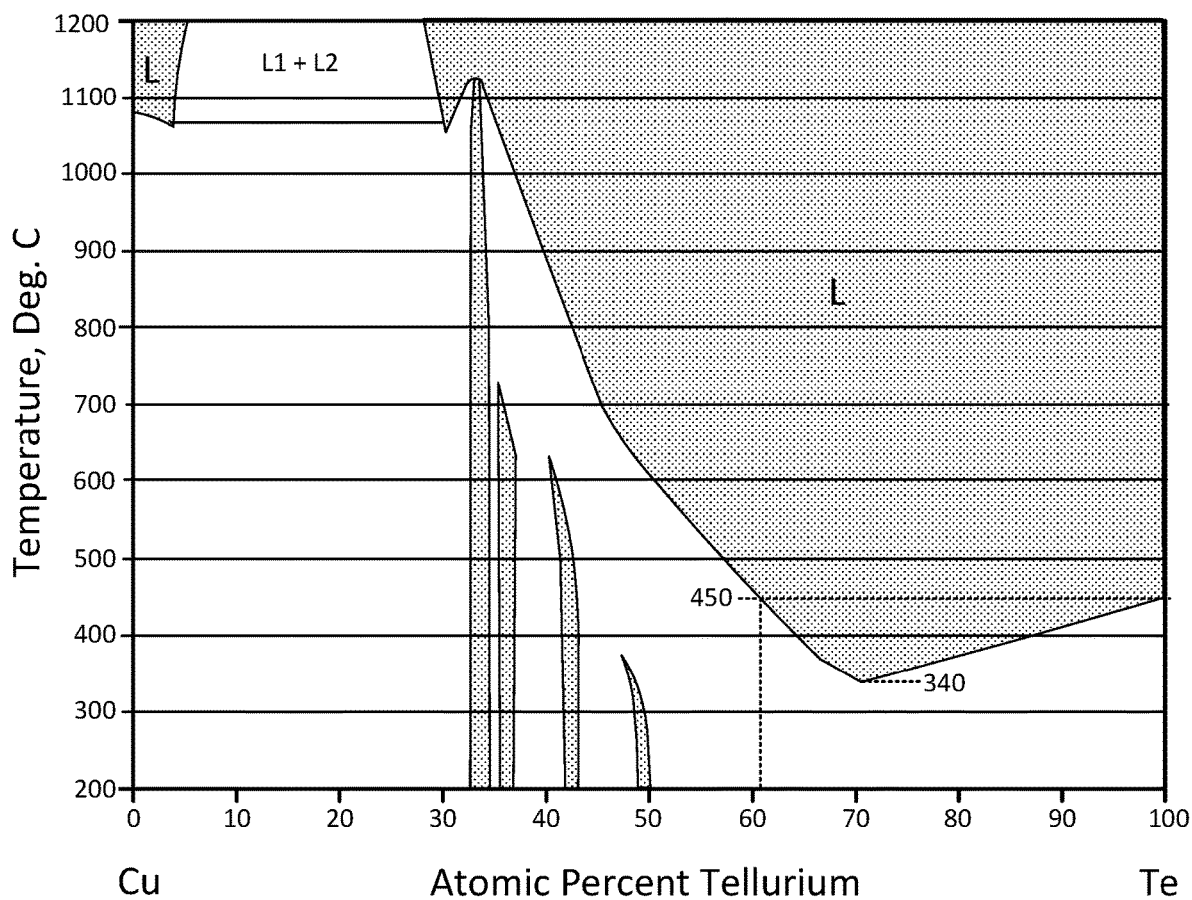
FIG. 8 is a binary copper-tellurium phase diagram showing liquid phase regions.

FIG. 8 is a binary phase diagram for copper and tellurium. The x axis represents the tellurium content in atomic percent and the y axis represents the temperature in degrees Celsius. Liquid phase regions are shown shaded in FIG. 8 and labeled with an L. Note that some compositions with about 33 atomic percent or more tellurium have a melting point well below that of pure copper (~1185° C.). In particular, compositions with about 33 to 35 at. %, 37 to 38 at. %, and 49-50 at. % have a melting point of about 200° C. or below. Copper-tellurium compositions with greater than about 61 at. % tellurium have a melting point below 450° C. As will be appreciated, methodologies of the present disclosure can utilize the relatively low melting point of these copper-tellurium compositions to provide a flowable copper that repairs defects 222 in the interconnect structure.

Note that pure chalcogen environments are not required. For instance, suitable chalcogen environments include oxides of sulfur, selenium, and tellurium (e.g., SO, SeO, TeO, $SO_2$, $SeO_2$, $TeO_2$, $SO_3$, $SeO_3$, $TeO_3$, $S_2O$, $Se_2O$, $Te_2O$, $S_2O_2$, $Se_2O_2$, $Te_2O_2$), hydrides of sulfur, selenium, and tellurium (e.g., $H_2S$, $H_2Se$, $H_2Te$), and fluorides of sulfur, selenium, and tellurium (e.g., $SF_6$, $SeF_6$, $TeF_6$, $SF_4$, $SeF_4$, and $TeF_4$). Optionally, such gases can be mixed with an inert carrier gas, such as nitrogen or argon. In other embodiments, solids of sulfur, selenium, or tellurium can be heated to vaporize the material and provide a chalcogen atmosphere. For example, crystalline sulfur ($S_8$) is heated in air, which may produce a sulfur environment with sulfur oxides. In an example where the chalcogen is sulfur, the integrated circuit 200 is placed in an atmosphere of hydrogen sulfide gas ($H_2S$) at a temperature of not more than 450° C., which in some cases is not more than 400°, or not more than 350°, or not more than 300°, or not more than 250° C., or not more than 200° C. In some embodiments, the heating 120 is carried out at a temperature in the range of 150 to 350° C., including 200-350° C., 200-300° C., 150-250° C., 150-300° C., 100-150° C., or 75-150° C. In some embodiments, the temperature is from 200-400° C., including 250-400° C., 250-350° C., 300-400° C., or 300-350° C. In a more general sense, heating 120 can be accomplished at any temperature range that won't damage devices of the integrated circuit but will allow defects 222 of the interconnect structure to be repaired by flowing the fill material within the confines of the interconnect structure.

Thus, depending on the source of heat applied and the composition of the materials being heated, the interconnect structure can be held at the selected temperature for a period of time (e.g., from 1 second to 24 hours) in a chalcogen environment during which time the chalcogen diffuses into, reacts with, or otherwise mixes with the copper or other fill material to form a liquid chalcogenide composition. While the heating time will vary from one embodiment to the next, in some example embodiments, the dwell or hold time is from 1 second to 4 hours, 30 minutes to 2 hours, 1 to 2 hours, 1 to 4 hours, 2 to 4 hours, 2 to 8 hours, 2 to 12 hours, 4 to 12 hours, 8 to 12 hours, 8 to 16 hours, 8 to 24 hours, 12 to 16 hours, 12 to 24 hours, or 16 to 24 hours. In some cases, heat times longer than 24 hours may be used. In one example embodiment, the integrated circuit 200 is exposed to hydrogen sulfide gas at a temperature of 250°-300° C. for about 0.5-3 hours, or until the fill material is saturated with sulfur. In another example, the interconnect structure is heated in a gaseous mixture of $H_2S$ and argon at 400° C. for about one hour.

Without being limited to any particular transport mechanism or theory, it is believed that the chalcogen atoms adsorb onto the copper surface, followed by a reaction to form one or more liquid copper-chalcogen compositions, and flow of the liquid copper composition due to gradients in density and concentration, and/or transport of the copper-chalcogen liquid according other thermodynamic processes. The particular chalcogen concentrations in gas, the processing temperature, and the hold time depend at least in part on the selected chalcogen along with the reaction kinetics and transport mechanism of that copper-chalcogen composition, the size and geometry of the vias and other interconnect features, and the amount and size of defects to be repaired, the acceptable number of defects per wafer, and other factors, as will be appreciated. For example, a copper interconnect structure with relatively few defects located close to the surface of the copper may be processed with shorter heat/dwell times, lower temperatures, or both, to repair any defects, as compared to a copper interconnect structure having defects located farther away from the surface of the copper or defects located deep in small vias. To this end, a requirement of zero defects per wafer may require different processing than a requirement permitting some defects, as will be appreciated.

Now with further reference to the example embodiment of FIG. 1, the method 100 continues with removing 125 the chalcogen from the interconnect structure using an annealing process. In accordance with one such embodiment, the interconnect structure is exposed to an inert or reducing environment. For example, after heating 120, the structure 200 is exposed to a reducing environment (e.g., a dilute mixture of hydrogen in nitrogen ($H_2+N_2$, also referred to as "forming gas")). Other suitable annealing environments include argon (Ar), hydrogen and argon mixture ($H_2$/Ar), oxygen ($O_2$), nitrogen ($N_2$), a mixture of helium and nitrogen (He/$N_2$), and a mixture of helium and argon (He/Ar). In some embodiments, removing the chalcogen is performed continuously with the processes of depositing 115 and heating 120 and involves a change in the gas environment.

In some such embodiments, the interconnect structure 120 continues to be held at the same temperature used to introduce (115) and heat (120) the chalcogen. In other embodiments, the temperature for removing 125 the chalcogen is greater than or less than the temperature used to heat (120) the chalcogen. For instance, in one example where the chalcogen is sulfur, the interconnect structure is exposed to 10% $H_2$ in an inert gas such as helium at a temperature from 25-450° C. to remove 125 sulfur from the copper. In one particular example, an anneal is performed at 350° C. in forming gas ($H_2$ in $N_2$) for about two hours. In some such embodiments, removing 125 the sulfur involves forming hydrogen sulfide ($H_2S$) according to one or both of the following chemical reactions:

$$CuS + H_2 \rightarrow Cu + H_2S \quad (1)$$

$$Cu_2S + H_2 \rightarrow 2Cu + H_2S \quad (2)$$

After removing 125 the chalcogen from the copper, the remaining copper has no more than 2 atomic percent (at %) of the chalcogen, in accordance with some embodiments. In some such embodiments, the copper has no more than 1.5 at %, or no more than 1.0 at %, or no more than 0.5 at % of the chalcogen after process 125. The extent of removing 125 the chalcogen may depend on the particular chalcogen, the stripping gas used, the temperature, the hold time, and other process variables, as will be appreciated.

Figure 5:
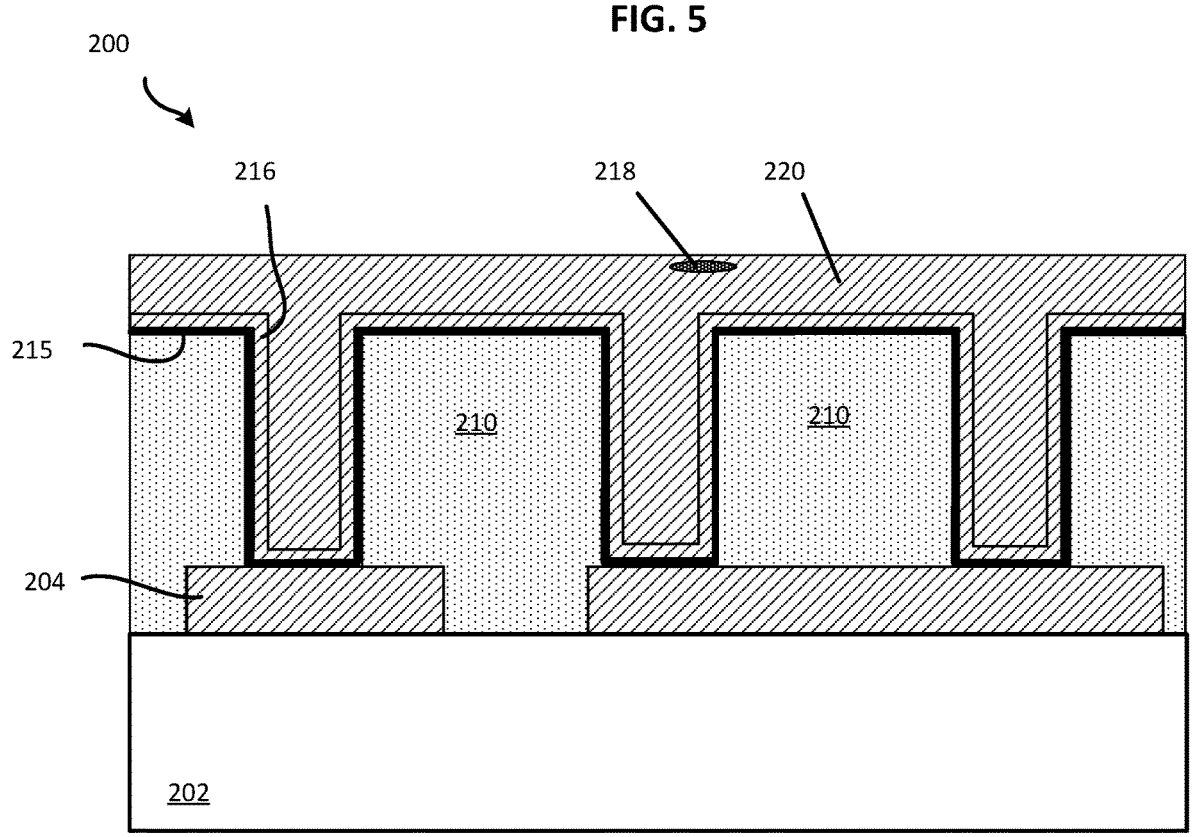
FIG. 5 illustrates the structure of FIG. 4A or 4B or 4C after heating the integrated circuit to reflow the conductive chalcogenide fill material, in accordance with an embodiment of the present disclosure.

FIG. 5 shows the integrated circuit 200 of FIG. 4 after removing 125 the chalcogen from the copper or other bulk fill material 220. In this example, all voids and similar defects 222 have been repaired. In some such embodiments, where the chalcogenide fill material is copper sulfide, the copper or other bulk fill material 220 in the resulting interconnect structure may exhibit trace levels of copper sulfide crystals 218 embedded in the copper or along a boundary between the copper and the barrier layer (if present) or surrounding dielectric, for example. Such residual copper chalcogenide crystals and/or the presence of a chalcogenide in the copper are indicative of method 100 since the presence of a chalcogen would not otherwise be expected in the interconnect structure.

Processes 110-125 can be performed for each metallization layer in the interconnect structure as needed prior to processing the next metallization layer, as will be appreciated. In some embodiments, electrical testing or other validation method may be performed at each stage of interconnect fabrication to determine whether defects are present, and whether processing with a chalcogen is needed to repair any such defects.

With further reference to FIG. 1, the method 100 continues with completing 130 the integrated circuit 200. Completing 130 the integrated circuit 200 may include any number of further processes, such as additional back-end-of-line (BEOL) processing, such as processing additional metallization layers, substrate grinding and bonding to another pre-formed substrate, cutting the processed wafer into chips (singulation), packaging chips onto a chip substrate, mounting the chip package to a printed circuit board, and other processing. Numerous variations and embodiments will be apparent in light of the present disclosure. Any suitable processing may be performed, as will be apparent in light of this disclosure.

Note that the processes in method 100 of FIG. 1 are shown in a particular order for ease of description. However, one or more of the processes may be performed in a different order or may not be performed at all (and thus be optional), in accordance with some embodiments. For example, the chalcogen-related portions of processes 115, 120 and 125 may be performed for some metallization layers and not for others. Likewise, some processes may be combined into a single process (such as 115 and 120), or a single continuous process having process knob variation (e.g., 115, 120 and 125). Processes described above are not exhaustive and some processes may include additional processing, such as lithography, deposition of isolation layers, and other such processes, as will be appreciated. Numerous variations on method 100 and the techniques described herein will be apparent in light of this disclosure.

Figure 9:
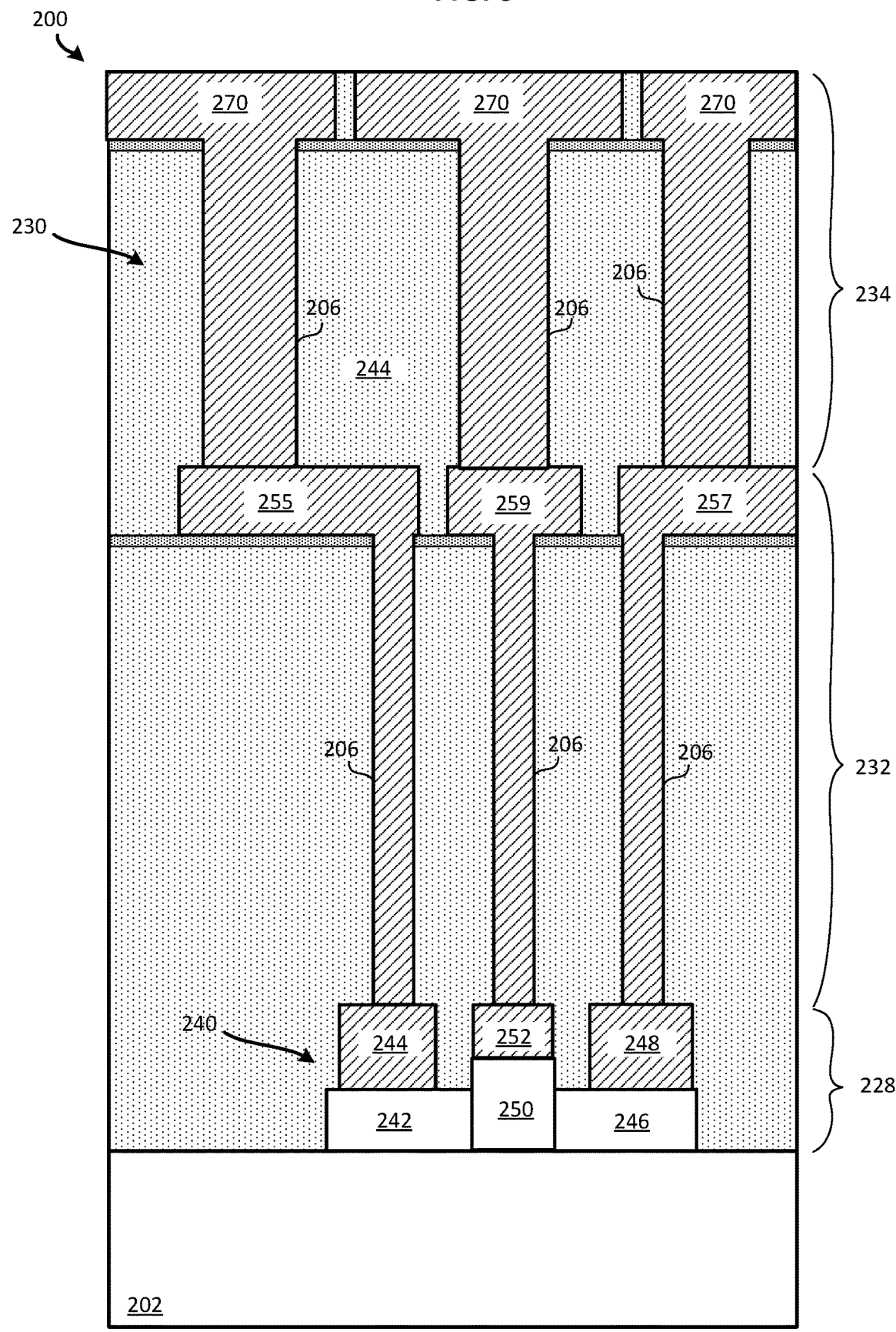
FIG. 9 illustrates a cross-sectional view of part of an integrated circuit structure that includes a device layer with a transistor device, a first metallization layer above the device layer, and a second metallization layer above the first metallization layer, in accordance with an embodiment of the present disclosure.

Referring now to FIG. 9, part of an integrated circuit 200 is illustrated in a cross-sectional view. As can be seen, the integrated circuit 200 includes a device level 228 including the transistor 240 on a base or substrate 202, a first metallization layer 232 above and in electrical contact with the transistor 240, and a second metallization layer 234 above and in electrical contact with the first metallization layer 232. Although illustrated as a single structure, the base 202 may include any one or more of a bulk semiconductor, a layer of semiconductor material, a layer of insulating material (e.g., an oxide), or other layer, as will be appreciated. The transistor 240 includes a source region 242 with a source contact 244, a drain region 246 with a drain contact 248, and a gate structure 250 with a gate contact 252. Copper-filled vias 206 in the first and second metallization layers 232, 234 electrically connect the source contact 244, drain contact 248, and gate contact 252 to contact pads 270 or other structures in the integrated circuit 200. In one embodiment, vias 206 connect the source contact 244 to a source line 255, the drain contact 248 to a bit line 257, and the gate contact 252 to a word line 259. The source line 255, bit line 257, and word line 259 can be configured as horizontal conductors that communicate with a plurality of such devices (e.g., hundreds, thousands, millions, or more), as will be appreciated. In this example, the vias 206 in the first metallization layer 232 have a lateral width of 40-50 nm (or less) and a pitch of about 120 nm (or less). In other embodiments, the lateral width is 40 nm or less, 30 nm or less, 20 nm or less, or 10 nm or less. In some embodiments, the pitch is 100 nm or less, 80 nm or less, 60 nm or less, 50 nm or less, 40 nm or less, 30 nm or less, or 20 nm or less. The copper in this example interconnect structure 230 is substantially free of voids and other defects, but may include some trace indications of chalcogen as previously explained.

In this example, two metallization layers 232, 234 are shown, but it is understood that the integrated circuit 200 may have more metallization layers, such as four, eight, sixteen, thirty-two, sixty-four, or more such layers. Methodologies according to the present disclosure may be applied as needed to any metallization layer. In addition, different chalcogens or combinations of chalcogens may be used for processing various metallization layers in the interconnect structure. Further, the extent of chalcogen removal may differ from one metallization layer to another. In light of such possible variations, an interconnect structure in accordance with the present disclosure may have metallization layers with two or more compositionally distinct copper conductors. Numerous variations and embodiments will be apparent in light of the present disclosure.

Example System

Figure 10:
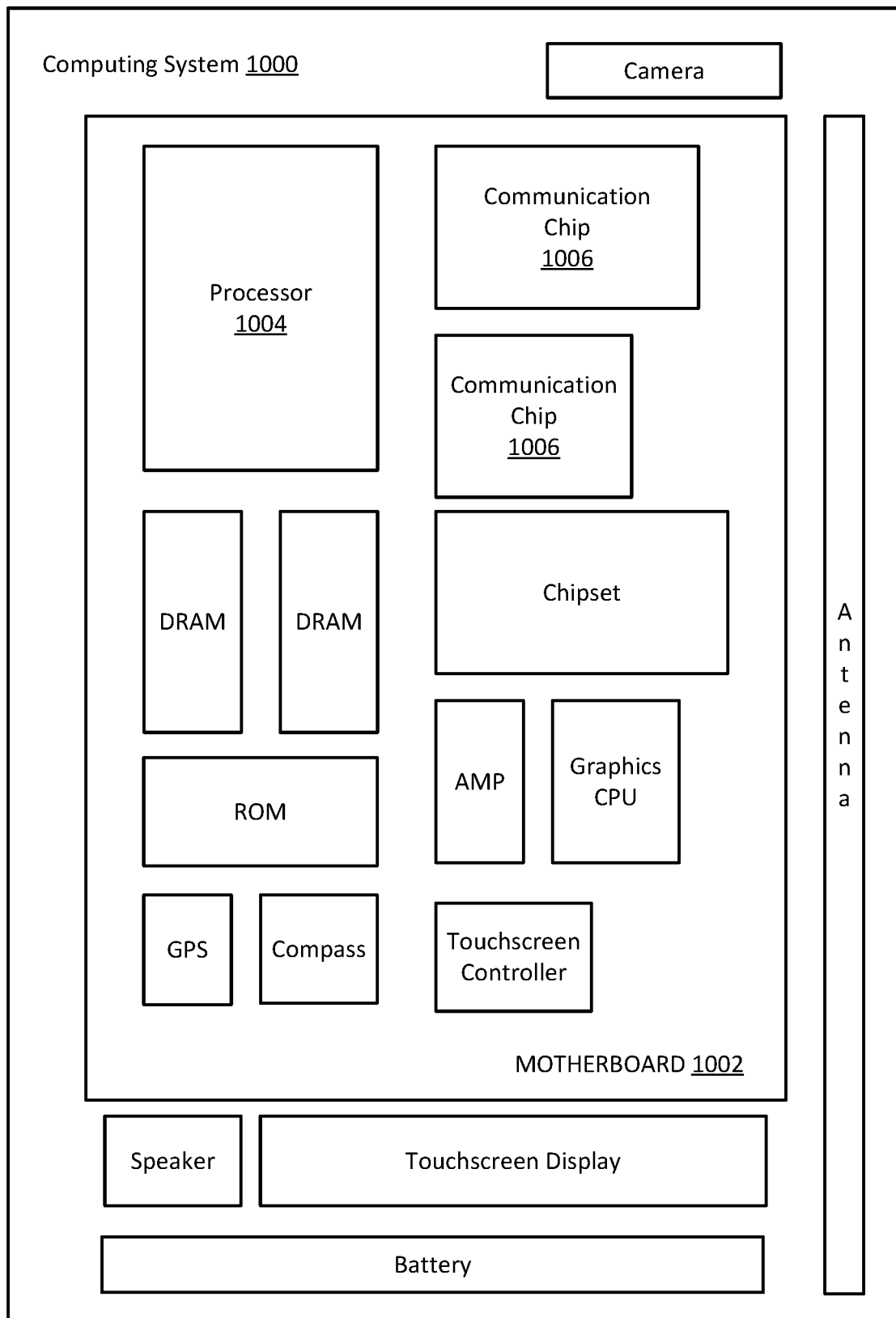
FIG. 10 illustrates an example computing system with an integrated circuit implementing interconnect structures disclosed herein, in accordance with some embodiments of the present disclosure.

FIG. 10 illustrates a computing system 1000 implemented with the interconnect structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory, such as an eDRAM incorporating recessed thin-channel TFTs as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., dynamic random access memory (DRAM) or embedded dynamic random access memory (eDRAM)), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures that includes an interconnect structure formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more interconnect structures formed using the techniques variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more interconnect structures formed using the techniques variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more interconnect structures or integrated circuits formed using the techniques variously described herein.

FURTHER EXAMPLE EMBODIMENTS

The following examples pertain to further embodiments, from which numerous permutations and configurations will be apparent.

Example 1 is an integrated circuit, comprising a base having one or more semiconductor devices; an insulating material over the base; and an interconnect structure over the base, the interconnect structure including a plurality of vertical conductors extending through the insulating material in a spaced-apart arrangement; wherein the interconnect structure comprises a conductive fill metal and a chalcogen, the chalcogen present in an amount of up to 5 atomic percent.

Example 2 includes the subject matter of Example 1, wherein the plurality of vertical conductors is part of a first metallization layer above the base.

Example 3 includes the subject matter of Examples 1 or 2, wherein conductors of the plurality of vertical conductors are electrically connected to the one or more semiconductor devices.

Example 4 includes the subject matter of any of Examples 1-3, wherein the one or more semiconductor devices include at least one transistor, and wherein the plurality of vertical conductors includes conductors electrically connected to a source region contact, a drain region contact, and/or a gate contact.

Example 5 includes the subject matter of any of Examples 1-4, wherein the conductive fill metal includes copper and the chalcogen includes sulfur in an amount of up to 2 atomic percent.

Example 6 includes the subject matter of any of Examples 1-5, wherein the conductive fill metal includes copper and the chalcogen includes selenium in an amount of up to 2 atomic percent.

Example 7 includes the subject matter of any of Examples 1-6, wherein the conductive fill metal includes copper and the chalcogen includes tellurium in an amount of up to 2 atomic percent.

Example 8 includes the subject matter of any of Examples 1-7, wherein the plurality of vertical conductors is free of voids.

Example 9 includes the subject matter of any of Examples 1-8, wherein the chalcogen includes a crystalline copper chalcogenide.

Example 10 includes the subject matter of Example 9, wherein the crystalline copper chalcogenide is copper sulfide.

Example 11 includes the subject matter of any of Examples 1-10, wherein the plurality of vertical conductors has a pitch of 120 nm or less.

Example 12 includes the subject matter of any of Examples 1-10, wherein the plurality of vertical conductors has a pitch of 80 nm or less.

Example 13 includes the subject matter of any of Examples 1-10, wherein the plurality of vertical conductors has a pitch of 50 nm or less.

Example 14 includes the subject matter of any of Examples 1-13, wherein at least some conductors of the plurality of vertical conductors have a horizontal dimension of 50 nm or less.

Example 15 includes the subject matter of any of Examples 1-14, wherein at least some conductors of the plurality of vertical conductors have a horizontal dimension of 30 nm or less.

Example 16 includes the subject matter of any of Examples 1-15, wherein at least some conductors of the plurality of vertical conductors have a horizontal dimension of 20 nm or less.

Example 17 is an integrated circuit with an interconnect structure, the interconnect structure comprising a layer of insulating material and a first conductive line and a second conductive line, each extending vertically through the layer of insulating material in a generally parallel, spaced apart arrangement, wherein the first and second conductive lines comprise copper and a chalcogen.

Example 18 includes the subject matter of Example 17, wherein the chalcogen is present in an amount of no greater than 2 atomic percent.

Example 19 includes the subject matter of Examples 17 or 18 further comprising a horizontal conductor in contact with the first and second conductive lines.

Example 20 includes the subject matter of Example 19, wherein the horizontal conductor is one of a wordline or a bitline.

Example 21 includes the subject matter of Examples 19 or 20, wherein the horizontal conductor is part of a first metallization layer, the integrated circuit further comprising a second horizontal conductor in a second metallization layer above the first metallization layer, wherein the second horizontal conductor is compositionally distinct from the first horizontal conductor.

Example 22 includes the subject matter of any of Examples 17-21 and further comprises one or more transistor devices below the insulating material, wherein the first conductive line contacts a source region contact and the second conductive line contacts a drain region contact.

Example 23 includes the subject matter of Example 22, wherein the interconnect structure further comprises a third conductive line in contact with a gate electrode.

Example 24 includes the subject matter of any of Examples 17-23, wherein the first and second conductive lines have a horizontal dimension of no greater than 50 nm.

Example 25 includes the subject matter of any of Examples 17-23, wherein the first and second conductive lines have a horizontal dimension of no more than 30 nm.

Example 26 includes the subject matter of any of Examples 17-25, wherein the first and second conductive lines are part of a first metallization layer above a device layer.

Example 27 is a memory structure that includes the integrated circuit of any of Examples 1-26.

Example 28 includes the subject matter of Example 27, wherein the memory structure is configured as a vertical memory structure.

Example 29 is a computing system comprising the integrated circuit of any of Examples 1-26.

Example 30 includes the subject matter of Example 29 and further comprises a touch screen display.

Example 31 includes the subject matter of Examples 29 or 30 and further comprises a processor.

Example 32 includes the subject matter of any of Examples 29-31 and further comprises a communication chip.

Example 33 is a method of fabricating an interconnect structure, the method comprising providing an integrated circuit having an interconnect structure that includes a plurality of via trenches defined in a dielectric layer; depositing copper to form a filled interconnect structure; exposing the copper to an environment including a chalcogen; heating the environment at a temperature of no more than 450° C., to form a liquid composition of copper and the chalcogen; and exposing the interconnect structure to a stripping gas to remove at least part of the chalcogen from the copper.

Example 34 includes the subject matter of Example 33, wherein the heating and exposing the copper to the environment are performed simultaneously.

Example 35 includes the subject matter of Examples 33 or 34, wherein depositing the copper includes depositing a diffusion barrier material, depositing a copper seed layer on or over the diffusion barrier material, and electroplating copper onto the copper seed layer.

Example 36 includes the subject matter of any of Examples 33-35, wherein the stripping gas is one of an inert gas or a reducing gas.

Example 37 includes the subject matter of any of Examples 33-36, wherein the chalcogen is selected from sulfur, selenium, and tellurium.

Example 38 includes the subject matter of any of Examples 33-37, wherein the chalcogen includes sulfur, selenium, or tellurium, and the environment includes an oxide, hydride, or fluoride of sulfur, selenium, or tellurium.

Example 39 includes the subject matter of any of Examples 33-37, wherein the chalcogen includes sulfur and the environment further includes hydrogen.

Example 40 includes the subject matter of any of Examples 33-36, wherein the chalcogen includes sulfur, selenium, or tellurium, and the environment further includes fluorine.

Example 41 includes the subject matter of any of Examples 33-40, wherein exposing the interconnect structure to a stripping gas removes the chalcogen from the copper, such that the copper has not more than 2 atomic percent of the chalcogen.

Example 42 includes the subject matter of any of Examples 33-40, wherein exposing the interconnect structure to a stripping gas removes the chalcogen from the copper, such that the copper has not more than 1 atomic percent of the chalcogen.

Example 43 includes the subject matter of any of Examples 33-42, wherein exposing the copper to an environment including the chalcogen is performed after or during depositing a copper seed layer and before the plating.

Example 44 includes the subject matter of any of Examples 33-42, wherein depositing the copper is performed by chemical deposition, physical vapor deposition, or plating and wherein exposing the copper to the environment including the chalcogen is performed by chemical deposition or physical vapor deposition.

Example 45 includes the subject matter of any of Examples 33-42, wherein exposing the copper to an environment including a chalcogen is performed by chemical vapor deposition or physical deposition after depositing the copper.

Example 46 is a method of fabricating an interconnect structure, the method comprising providing an interconnect structure that includes a dielectric defining a plurality of via openings; depositing a conductive seed layer; depositing a chalcogen layer on the conductive seed layer; electroplating with a metal to provide a plated interconnect structure; heating the plated interconnect structure to a temperature of no more than 450° C. to form a liquid composition of the metal and the chalcogen; and exposing the interconnect stack to a stripping gas to remove at least part of the chalcogen from the metal.

Example 47 includes the subject matter of Example 46, wherein the metal is copper.

Example 48 includes the subject matter of Examples 46 or 47, wherein the chalcogen is selected from sulfur, selenium, and tellurium.

Example 49 includes the subject matter of any of Examples 46-48, wherein exposing the interconnect stack to a stripping gas removes the chalcogen to a level of not more than 2 atomic percent.

Example 50 includes the subject matter of any of Examples 46-48, wherein exposing the interconnect stack to a stripping gas removes the chalcogen to a level of not more than 1 atomic percent.

Example 51 includes the subject matter of any of Examples 46-50, wherein depositing the metal is performed by chemical vapor deposition, physical vapor deposition, or atomic layer deposition.

Example 52 includes the subject matter of any of Examples 46-51, wherein depositing the chalcogen is performed by chemical vapor deposition, physical vapor deposition, or atomic layer deposition.

Example 53 includes the subject matter of any of Examples 56-50, wherein depositing the metal and depositing the chalcogen is performed concurrently by chemical vapor deposition, physical vapor deposition, or atomic layer deposition.

Example 54 is a method of fabricating an interconnect stack, the method comprising providing a semiconductor wafer having an interconnect stack that includes a dielectric defining a plurality of via openings; depositing a metal and a chalcogen to provide a filled interconnect structure; heating the filled interconnect structure to a temperature of no more than 450° C. to form a liquid composition of the metal and the chalcogen; and exposing the interconnect stack to a stripping gas to remove at least part of the chalcogen from the metal.

Example 55 includes the subject matter of Example 54, wherein the metal is copper.

Example 56 includes the subject matter of Examples 54 or 55, wherein the chalcogen is selected from sulfur, selenium, and tellurium.

Example 57 includes the subject matter of any of Examples 54-56, wherein exposing the interconnect stack to a stripping gas removes the chalcogen to a level of not more than 2 atomic percent.

Example 58 includes the subject matter of any of Examples 54-56, wherein exposing the interconnect stack to a stripping gas removes the chalcogen to a level of not more than 1 atomic percent.

Example 59 includes the subject matter of any of Examples 54-58, wherein each of depositing the metal and depositing the chalcogen is performed by chemical vapor deposition, physical vapor deposition, or electroplating.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
a base comprising one or more semiconductor devices;
an insulating material over the base; and
an interconnect structure over the base, the interconnect structure including a plurality of vertical conductors extending through the insulating material in a spaced-apart arrangement, wherein at least some conductors of the plurality of vertical conductors have a maximum horizontal dimension of 50 nm or less and are electrically connected to at least one of the one or more semiconductor devices;
wherein the interconnect structure comprises a conductive fill metal and a chalcogen, the chalcogen selected from the group consisting of sulfur present in an amount between about 2 atomic percent and 5 atomic percent, and tellurium present in an amount of less than 2 atomic percent.

2. The integrated circuit of claim 1, wherein the plurality of vertical conductors is part of a first metallization layer above the base.

3. An integrated circuit, comprising: a device layer comprising one or more semiconductor devices; and
an interconnect structure over the device layer, the interconnect structure including a plurality of vertical conductors extending through insulating material in a spaced-apart arrangement;
wherein the interconnect structure comprises a conductive fill metal and a chalcogen, the chalcogen present in an amount of up to 5 atomic percent, and wherein the conductive fill metal includes copper and the chalcogen includes selenium in an amount of up to 2 atomic percent.

4. The integrated circuit of claim 1, wherein the one or more semiconductor devices include at least one transistor, and wherein the plurality of vertical conductors includes a conductor connected to a source region contact, a drain region contact, and/or a gate contact.

5. The integrated circuit of claim 1, wherein the conductive fill metal includes copper and the chalcogen includes the sulfur.

6. The integrated circuit of claim 3, wherein conductors of the plurality of vertical conductors are electrically connected to at least one of the one or more semiconductor devices.

7. The integrated circuit of claim 1, wherein the conductive fill metal includes copper and the chalcogen includes the tellurium.

8. The integrated circuit of claim 1, wherein the chalcogen includes a crystalline copper chalcogenide.

9. The integrated circuit of claim 8, wherein the crystalline copper chalcogenide is copper sulfide.

10. The integrated circuit of claim 1, wherein the plurality of vertical conductors has a pitch of 50 nm or less.

11. The integrated circuit of claim 6, wherein at least some conductors of the plurality of vertical conductors have a horizontal dimension of 50 nm or less.

12. A memory structure with a plurality of transistor devices and an interconnect structure, the interconnect structure comprising
a layer of insulating material over the plurality of transistor devices; and
a first conductive line and a second conductive line each extending vertically through the layer of insulating material in a generally parallel, spaced apart arrangement and each having a maximum horizontal dimension of 50 nm or less;
wherein the first and second conductive lines comprise copper and a chalcogen selected from the group consisting of sulfur present in an amount between about 2 atomic percent and 5 atomic percent, and tellurium present in an amount of less than 2 atomic percent, and wherein the first and second conductive lines are electrically connected to one or more of the plurality of transistor devices.

13. The memory structure of claim 12, wherein the chalcogen is the sulfur.

14. The memory structure of claim 12 further comprising a horizontal conductor in contact with the first and second conductive lines.

15. The memory structure of claim 14, wherein the horizontal conductor is part of a first metallization layer above the plurality of transistor devices, the integrated circuit memory structure further comprising a second horizontal conductor in a second metallization layer above the first metallization layer, wherein the second horizontal conductor is compositionally distinct from the first horizontal conductor.

16. The memory structure of claim 14 further comprising one or more transistor devices below the insulating material, wherein the first conductive line contacts a source region contact of the plurality of transistor devices and the second conductive line contacts a drain region contact of the plurality of transistor devices.

17. The memory structure of claim 16, wherein the interconnect structure further comprises a third conductive line in contact with a gate electrode of the plurality of transistor devices.

18. The memory structure of claim 12, wherein the first and second conductive lines are part of a first metallization layer above a device layer.

19. The memory structure of claim 12 configured as a vertical memory structure.

20. The integrated circuit of claim 11, wherein the chalcogen comprises crystalline copper sulfide.

* * * * *